US010345548B2

(12) United States Patent
Dural et al.

(10) Patent No.: US 10,345,548 B2
(45) Date of Patent: Jul. 9, 2019

(54) ANODICALLY BONDED CELLS WITH OPTICAL ELEMENTS

(71) Applicant: TRUSTEES OF PRINCETON UNIVERSITY, Princeton, NJ (US)

(72) Inventors: Nezih Dural, Bordentown, NJ (US); Michael V Romalis, Princeton, NJ (US)

(73) Assignee: THE TRUSTEES OF PRINCETON UNIVERSITY, Princeton, NJ (US)

( * ) Notice: Subject to any disclaimer, the term of this patent is extended or adjusted under 35 U.S.C. 154(b) by 715 days.

(21) Appl. No.: 14/499,026

(22) Filed: Sep. 26, 2014

(65) Prior Publication Data

US 2017/0023761 A1   Jan. 26, 2017

Related U.S. Application Data

(60) Provisional application No. 61/883,222, filed on Sep. 27, 2013.

(51) Int. Cl.
*G02B 7/00* (2006.01)
*G01R 33/26* (2006.01)
(Continued)

(52) U.S. Cl.
CPC ............. *G02B 7/004* (2013.01); *G01R 33/26* (2013.01); *G02B 7/008* (2013.01); *G02B 7/02* (2013.01);
(Continued)

(58) Field of Classification Search
CPC ... B81C 2203/031; C03C 27/00; C03C 27/02; C03C 27/06; G02B 7/00; G02B 7/004;
(Continued)

(56) References Cited

U.S. PATENT DOCUMENTS 5,726,752 A * 3/1998 Uno ..................... G01N 21/031
356/244
6,195,214 B1 * 2/2001 Muray ..................... H01J 9/18
359/819
(Continued)

FOREIGN PATENT DOCUMENTS

JP   2008-164576 A   7/2008
WO   2013/072967      5/2013

OTHER PUBLICATIONS

International Search Report and Written Opinion dated Feb. 9, 2015 from International Application No. PCT/US2014/057902, pp. 1-11.
(Continued)

*Primary Examiner* — Ricky L Mack
*Assistant Examiner* — Gary W O'Neill
(74) *Attorney, Agent, or Firm* — MH2 Technology Law Group, LLP

(57) ABSTRACT

The disclosure provides an optical apparatus including at least one optical element including glass, at least one support including silicon and a housing including glass. Furthermore, the at least one optical element and the at least one support can be anodically bonded together, and the at least one support and the housing can be anodically bonded together. The disclosure further provides a method for fabricating optical components with durable bonds and incorporates active alignment.

26 Claims, 15 Drawing Sheets

(51) Int. Cl.
  *G02B 7/02* (2006.01)
  *G02B 7/18* (2006.01)
  *G02B 7/182* (2006.01)
  *G02B 1/11* (2015.01)

(52) U.S. Cl.
  CPC ............. *G02B 7/18* (2013.01); *G02B 7/1824* (2013.01); *G02B 1/11* (2013.01)

(58) Field of Classification Search
  CPC ...... G02B 7/008; G02B 7/182; G02B 7/1824; G02B 7/02; G01R 33/26; G01N 21/031
  See application file for complete search history.

(56) References Cited

U.S. PATENT DOCUMENTS

| | | | |
|---|---|---|---|
| 6,674,159 B1 * | 1/2004 | Peterson | B81B 7/0067 257/431 |
| 2006/0022761 A1 * | 2/2006 | Abeles | G04F 5/14 331/94.1 |
| 2006/0267023 A1 * | 11/2006 | McBride | B81C 3/001 257/77 |
| 2009/0095414 A1 | 4/2009 | McBride | |
| 2009/0101806 A1 | 4/2009 | Masuda | |

OTHER PUBLICATIONS

Sheng, D. et al., Subfemtotesia Scalar Atomic Magnetometry Using Multipass Celts. Physical Review Letters, Apr. 1, 2013, vol. 110, No. 16, pp. 160802-1-160802-5.

Altmann, J. et al. Two-mirror multipass absorption cell. Applied Optics, Mar. 15, 1981, vol. 10, No. 6, pp. 995-999.

Li, S. et al., "Optical rotation in excess of 100 rad generated by Rb vapor in a multipass cell", Physical Review A, vol. 84, No. 6, 2011, 4 pages.

Cooper, R. et al., "Atomic Magnetometer Multisensor Array for rf Interference Mitigation and Unshielded Detection of Quadrupole Resonance", Physical Review Applied, vol. 6, No. 6, 14 pages.

Japanese Office Action dated Aug. 28, 2018 in corresponding JP Application No. 2016-545248, 7 pages.

* cited by examiner

ANODICALLY BONDED CELLS WITH OPTICAL ELEMENTS

PRIORITY

This application claims the benefit of priority from U.S. Provisional Application No. 61/883,222, filed Sep. 27, 2013, which is herein incorporated by reference in its entirety.

STATEMENT REGARDING FEDERALLY SPONSORED RESEARCH OR DEVELOPMENT

This invention was made with U.S. Government support under Grant #FA8650-09-1-7943 awarded by the United States Air Force/Air Force Research Laboratory. The U.S. Government has certain rights in the invention.

FIELD

This disclosure relates to systems using aligned optical elements, and methods directed to the alignment of optical elements.

BACKGROUND

In many applications it is desirable to create optical assemblies that are stable, easy to fabricate, and are capable of operating in harsh chemical and thermal environments. For example, it is desirable to have optical assemblies that can operate in the presence of alkali-metal vapor and can be heated up to 200° C. without alignment changes. It is further desirable to have optical assemblies that are vacuum-compatible and have low outgassing properties. FIG. 1 depicts a prior art multi-pass cell 100. Multi-pass cell 100 can be hermetically sealed and filled with alkali-metal vapor 102. The multi-pass cell 100 can be made using two cylindrical mirrors 130 and 140. One mirror (generally a front mirror 130) can have a hole or aperture 132 at a center of the mirror in order to allow for the entrance and exit of beams (such as laser beam 195 from lasing source 190). The second mirror can include back mirror 140. Curvature axes of the two mirrors 130 and 140 can be oriented at a specific angle relative to each other, and a distance between the mirrors 130 and 140 can be accurately set to allow for a multi-pass beam pattern between the mirrors 130. It can be advantageous to place both mirrors 130 and 140 inside a vacuum-sealed enclosure to eliminate losses associated with light passing through optical windows.

However, consequences of using alkali-metal vapor over the above-described temperature range can largely preclude the use of adhesives to mount optical elements 130 and 140. Moreover, while various optical contacting techniques can be used to mount optical elements 130 and 140, such optical contacting techniques can require atomic level polishing and flatness, and so can be expensive to implement.

SUMMARY

Systems and methods using anodic bonding are provided. Anodic binding can be a fairly robust technique, and does not place stringent requirements on surface preparation.

Consistent with an embodiment, this disclosure describes glass cells that can contain internal optical elements, such as mirrors, lens, prisms, etc., and processes of fabricating the same. Consistent with an embodiment, the glass cells can be configured to satisfy several requirements, such as being hermetically sealed, contain optical elements with precision alignment, and configured to withstand chemically reactive substances (gas or liquid), such as alkali-metal vapor, at high temperature for prolonged periods of time. In addition, or alternatively, the glass cells can be configured to contain any substance (gas or liquid) that is desired to be free of contamination. Certain embodiments directed to methods of fabricating such cells and/or elements also do not require particularly high quality optical surfaces in order to operate in such environments (such as, without limitation, an alkali-metal or other chemically reactive environment).

As discussed herein, anodic bonding is a process of bonding silicon to glass (such as PYREX or other suitable borosilicate glass having a coefficient of thermal expansion matching that of silicon) by applying an electric field at an elevated temperature. Disclosed is a procedure for fabricating optical structures, systems, and apparatus with active alignment—such as by using a laser—and then fixing certain optical components and other structures using anodic bonding. The processes and structures disclosed herein can allow one to make hermetic structures that can withstand high-temperature alkali-metal vapor or other chemically reactive environments (which may include gas or liquid phases). Moreover, the hermetic structures can be used to contain substances (gas or liquid) desired to be free of contamination.

In one embodiment, optical elements can be held in a fixture device allowing fine position adjustment and can be aligned relative to each other using a laser. The optical elements can then be held in a custom chuck with wax on one side. In this way, a portion of the optical elements can be cut-off or removed by a diamond wheel and polished. The portion removed can create a pre-aligned surface for anodic bonding. The optical elements can then be removed from the custom chuck by melting the wax. One of the optical elements can then be anodically bonded to a substrate of silicon (e.g., a silicon wafer). The optical elements can then be placed again in the fixture device and the second optical element can be aligned relative to the first using a laser. The second optical element can then be mechanically clamped to the silicon substrate and anodically bonded. The resulting construction of the silicon substrate and glass optical elements can then be anodically bonded into a glass cell to make a hermetic structure.

In another embodiment, a back surface of an optical element can be bonded to a silicon disk that is larger (i.e., that has a larger cross-section, for example). The edges of the silicon disk (such as a silicon wafer) that extend beyond the optical element can then be anodically bonded to exposed edges of a glass tube so that the optical element is inside the glass tube. A second optical element can be actively aligned (for example, using a laser), anodically bonded to a second silicon disk (such as a silicon wafer with a larger cross-section, again), and the resulting structure anodically bonded to an opposing exposed end of the glass tube, thus providing a hermetic structure with two aligned optical elements inside.

Suitable glass structures for anodically bonding to silicon structures can include PYREX glass, or other suitable borosilicate glass having a coefficient of thermal expansion matching that of silicon. Preferably, coatings that may be present on the glass optical elements should be configured to withstand the temperature of 250 C during the anodic bonding.

Consistent with this disclosure, the process can be commercialized for making sealed glass cells with internal optical components. Applications can include magnetometry with multi-pass cells. Other applications, such as "on-chip"

applications, can be fabricated consistent with the current disclosure with suitable scaling.

In one aspect, the present disclosure is directed to an optical apparatus including at least one optical element including glass, at least one support including silicon and a housing including glass. Furthermore, the at least one optical element and the at least one support can be anodically bonded together. Further still, the at least one support and the housing can be anodically bonded together.

In a further aspect, the present disclosure is directed to a method providing optical components with durable bonds. The method can include providing at least one optical element including glass, providing at least one support including silicon, and providing a housing including glass. Furthermore, the at least one optical element and the at least one support can be anodically bonded together, and the at least one support and the housing can be anodically bonded together.

In further aspects consistent with the disclosure, the glass can borosilicate glass, and the at least one optical element can be a mirror. Further still, the glass can include PYREX. Moreover, the at least one optical element is selected from a set consisting of: a lens and a prism.

Consistent with further embodiments, an apparatus or method can include providing a second optical element including glass. Further still, the second optical element and the at least one support can be anodically bonded to one another.

In further embodiments, the at least one optical element can be a mirror with an aperture for entrance and exit of a laser beam, and the second optical element can be a window with anti-reflective coating. Further still, the at least one optical element can be a mirror with an aperture for entrance and exit of a laser beam, and the second optical element can be a mirror, a lens or a prism.

In further embodiments, the at least one optical element and the second optical element can define a multi-pass cavity. Further still, the housing can include a cell, and the housing can be configured to couple to a vacuum system for evacuating and filling the cell with a chemically reactive substance (liquid or gas), such as, without limitation, alkali-metal vapor.

Further still, the support can be anodically bonded to the housing on a side of the support and about a perimeter of the side, and an inner portion of the side can be bonded to the at least one optical element. Moreover, the support can be anodically bonded to the housing on a side of the support, and the at least one optical element can be anodically bonded to an opposite side of the support.

Further still, providing the second optical element including glass can include actively aligning the at least one optical element and the second optical element. Additional features and advantages will be set forth in part in the description which follows, being apparent from the description of or learned by practice of the disclosed embodiments. The features and advantages will be realized and attained by means of the elements and combinations particularly pointed out in the appended claims.

It is to be understood that both the foregoing general description and the following detailed description are exemplary and explanatory only and are not restrictive of the scope of the embodiments, as claimed.

BRIEF DESCRIPTION OF THE DRAWINGS

The accompanying drawings, which are incorporated in and constitute a part of this specification, illustrate embodiments and, together with the description, serve to explain the features, advantages, and principles of the disclosed embodiments.

DETAILED DESCRIPTION

Reference will now be made in detail to the one or more embodiments, characteristics of which are illustrated in the accompanying drawings. Wherever possible, the same reference numbers will be used throughout the drawings to refer to the same or like parts.

Figure 1:
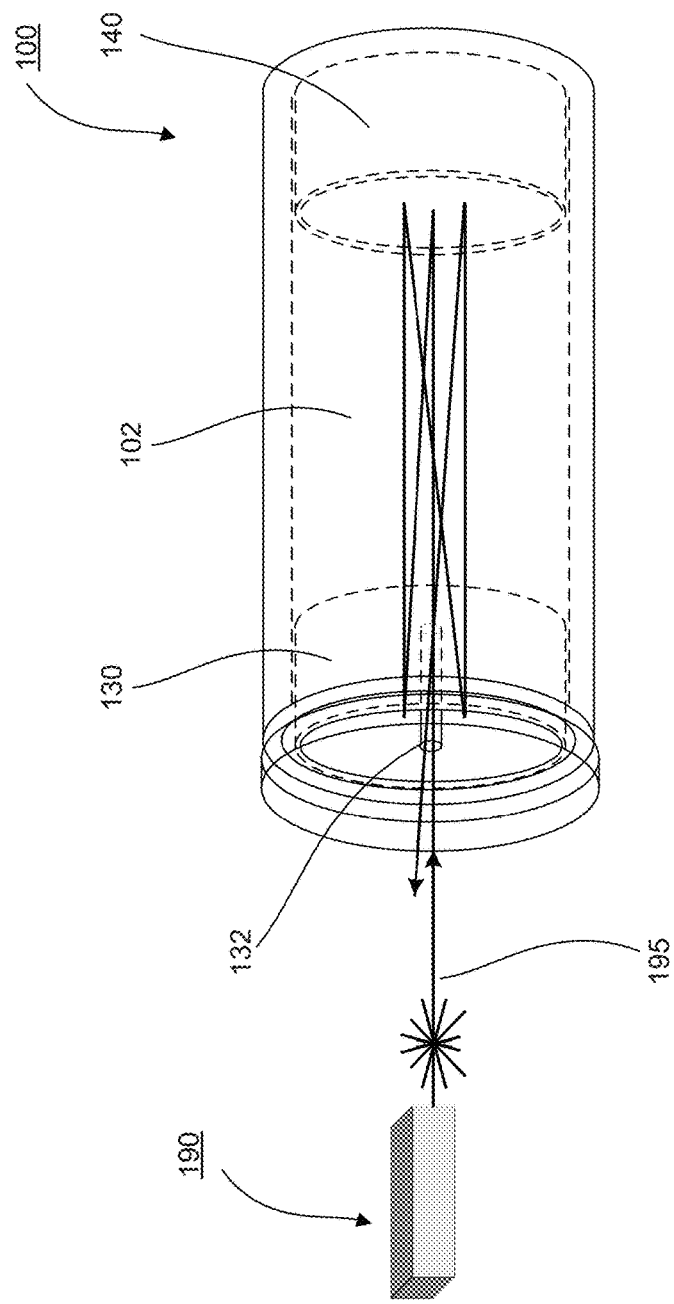
FIG. 1 depicts a prior art multi-pass cell.
Figure 2:
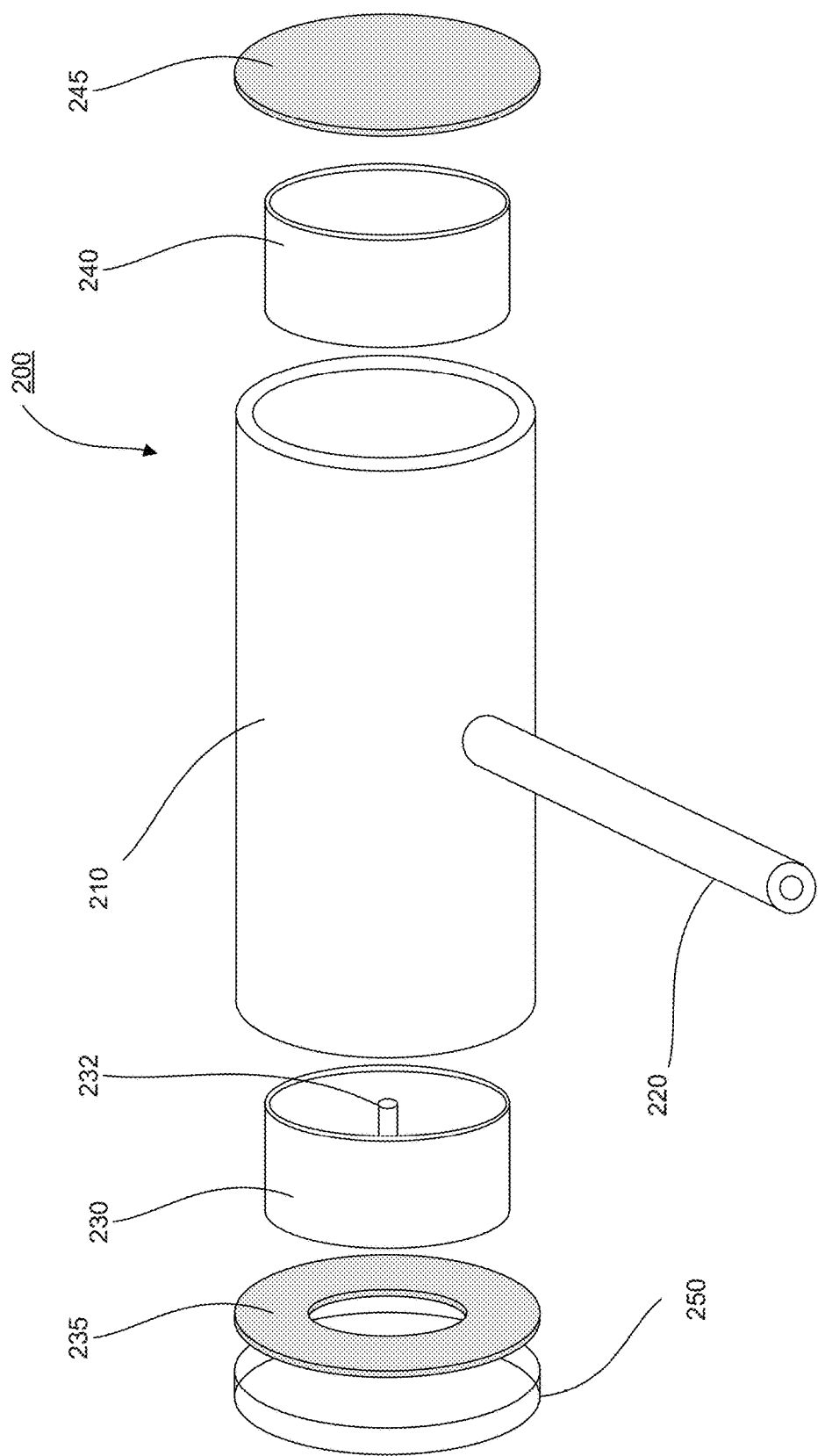
FIG. 2 depicts an exploded view of an embodiment consistent with the disclosure.

FIG. 2 depicts an exploded view of one embodiment of a multi-pass cell 200 consistent with the current disclosure. Shown in FIG. 2 are front mirror 230 with aperture 232, front silicon disk 235, entrance window 250, cylindrical glass cell 210, back mirror 240 and back silicon disk 245. Consistent with this disclosure, the back surfaces of front mirror 230 and back mirror 240 (i.e., the sides of front mirror 230 and back mirror 240 that face away from the inside of glass cell 210), can be polished lambda/2 or better at 632 nm and scratch-dig can be 40-20 or better.

Front mirror 230 can generally have a hole or aperture 232 for entrance and exit beams. Consistent with the disclosure, each of the mirrors 230 and 240 can have a silicon wafer bonded to its back, such that the respective silicon wafer has the same or larger diameter than the diameter of cylindrical glass cell 210. As disclosed herein, each silicon wafer (such as silicon disk 235 and silicon disk 245) can be prepared differently for front mirror 230 and back mirror 240. For example, a hole can be opened on front silicon disk 235, where the hole is available for the entrance and exit beams. A size of the hole on front silicon disk 235 can be as large as a surface antireflection ("AR") coating area on entrance window 250. An entrance window 250 can include AR coating on both sides in the central area of window 250 associated with the hole in front disk 250 and aperture 232. Surface flatness of AR coated entrance window 250 can be lambda/2 at 632 nm and scratch-dig can be 40-20. Consistent with the embodiment of FIG. 2, entrance window 250 is not coated in an annular area from an outside edge (or perimeter) associated with front silicon disk 235 (which can be an annular area 2-3 mm from edge). Such a perimeter region of entrance window 250 can remain uncoated so that the annulus bare glass region is available for an anodic bond with front silicon disk 235. Front mirror 230, back mirror 240, and cylindrical glass cell 210 can include PYREX glass (or other suitable borosilicate glass), and the coefficient of thermal expansion ("CTE") of each of silicon disk 235 and silicon disk 245 can match the CTE of PYREX glass (or other suitable borosilicate glass), so there is no stress on the anodic bond components at high temperature.

Before anodic bonding, the back surfaces of front mirror 230 and back mirror 240, the portions of the cylindrical glass cell 210 intended to bond with the silicon disks, and the annular region of entrance window 250 can be cleaned with RCA acid bath or PIRANHA solution.

Figure 3:
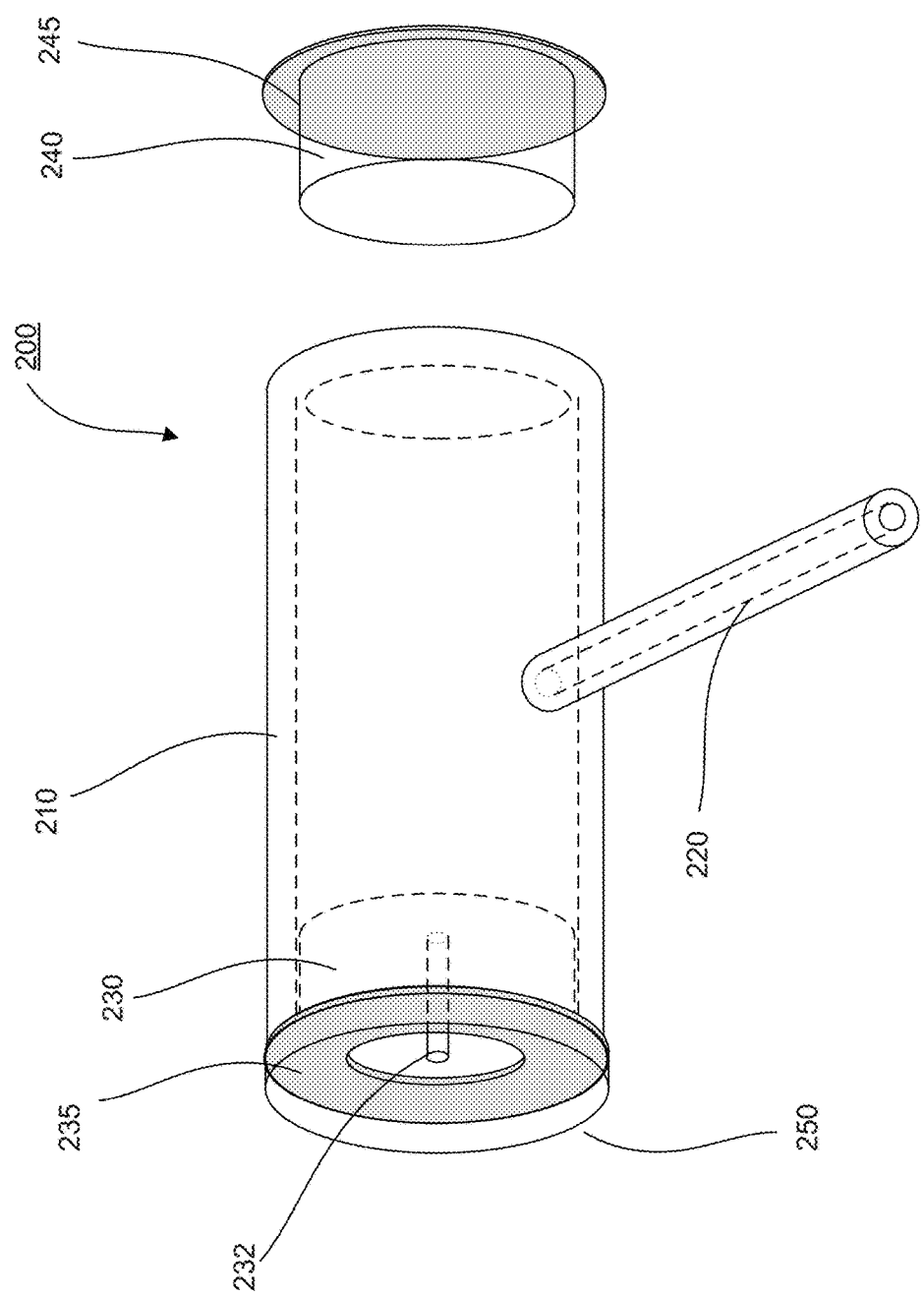
FIGS. 3-5 depict various processes associated with fabricating an embodiment consistent with FIG. 2.

As discussed above, the front mirror 230 can have aperture 232 for an entrance and exit beam. Moreover, consistent with the disclosure, the opening of aperture 232 on the back side of front mirror 230 can be much larger than a corresponding opening on the curvature side of front mirror 230. Such a configuration can allow for easy injection input beam at a large angle. After cleaning front mirror 230 and front silicon disk 235, an anodic bond can be applied on the components in a clean room or a dust free environment, so that the front mirror 230 and front silicon disk 235 are bonded as shown in FIG. 3. The back silicon disk 245 need not have central hole. After front silicon disk 235 is anodically bonded to back surface of front mirror 230, the non-central annular region of entrance window 250 can be anodically bonded to the front silicon disk 235 in order to hold entrance window 250 and front mirror 230 together.

Consistent with the disclosure, back mirror 240 and back silicon disk 245 can be anodically bonded together in the manner described above for front mirror 230 and front silicon disk 235. Moreover, an additional uncoated PYREX window (not shown) or other suitable borosilicate glass window can be bonded to the exposed (back) side of silicon disk 245. Such an additional window can provide (for example, and without limitation) structural support to multi-pass cell 200.

The bonded combination of front mirror 230, entrance window 250, and front silicon disk 235, and the bonded combination of back mirror 240 and back silicon disk 245 can be placed on optical alignment stages in order to set a rotation angle and distance necessary for operation of a multi-pass cavity. For example, front mirror 230 can be configured with a rotation stage with tilt mechanism and back mirror 240 can be configured with a rotation stage with tilt mechanism, all configured on a translation stage so as to allow for the necessary degrees of freedom to position both mirrors (i.e., front mirror 230 and back mirror 240). After configuring front mirror 230 and back mirror 240 to have a desired beam pattern and number of beam passes between the mirrors on an optical alignment stage, a distance can be measured from back surface of front mirror 230 to the back surface of the back mirror 240. That distance will be the length of cylindrical glass cell 210 from one end to other end. The distance measurement can be done with tolerance of +/−3 micron. In addition, for purposes of later ensuring that the front mirror 230 and the back mirror 240 are oriented correctly in the assembled multi-pass cell 200, orientation marks can be placed on the edges of front mirror 230 and back mirror 240 while they are fixed on the optical alignment stage.

Cylindrical glass cell 210 can be configured with stem 220 to connect to a vacuum system (not shown) for evacuating and filling a completed multi-pass cell 200 with alkali-metal vapor. The stem 220 can be attached to cylindrical glass cell 210 using glass blowing techniques. After configuring cylindrical glass cell 210 with stem 220, cylindrical glass cell 210 can be cut from both ends so that it exhibits the distance required of the multi-pass cell 200 (i.e., the distance measured above).

In order to take the subsequent grinding and polishing into account, both ends of cylindrical glass cell 210 can be configured to have an additional extra 0.5 mm length. Moreover, both ends of cylindrical glass cell 210 can be polished so that they can be anodically bonded to the front silicon disk 235 and the back silicon disk 245 (where both the front and back disks 235 and 245 are already anodically bonded to front mirror 230 and back mirror 240). Surface finish can be better than lambda/2 at 632 nm. Scratch-dig can be 10-5 on both end surfaces after polishing.

After the grinding and polishing processes are completed, cylindrical glass cell 210 can exhibit the previously measured distance with a tolerance of +/−10 micron. Moreover, parallelism between both ends can preferably exhibit a tolerance of +/−1 min or less.

To complete assembly of multi-pass cell 200, the combination of entrance window 250, front silicon disk 235, and front mirror 230 can be anodically bonded to one end of cylindrical glass cell 210. Specifically, because the diameter of front mirror 230 is smaller than the diameter of front silicon disk 235, there can be sufficient annulus area on front silicon disk 235 to anodically bond front silicon disk 235 to the edge of cylindrical glass cell 210. Moreover, the relative orientation of cylindrical glass cell 210 to front mirror 230 can be determined and/or fixed by examining the mark (described earlier) previously placed on the edge of front mirror 230. After orienting and centering the front mirror 230 with cylindrical glass cell 210, an anodic bond can be applied to bond the front silicon disk 235 and the cylindrical glass cell 210 and vacuum-seal one end of multi-pass cell 200. This is depicted in FIG. 3.

Figure 4:
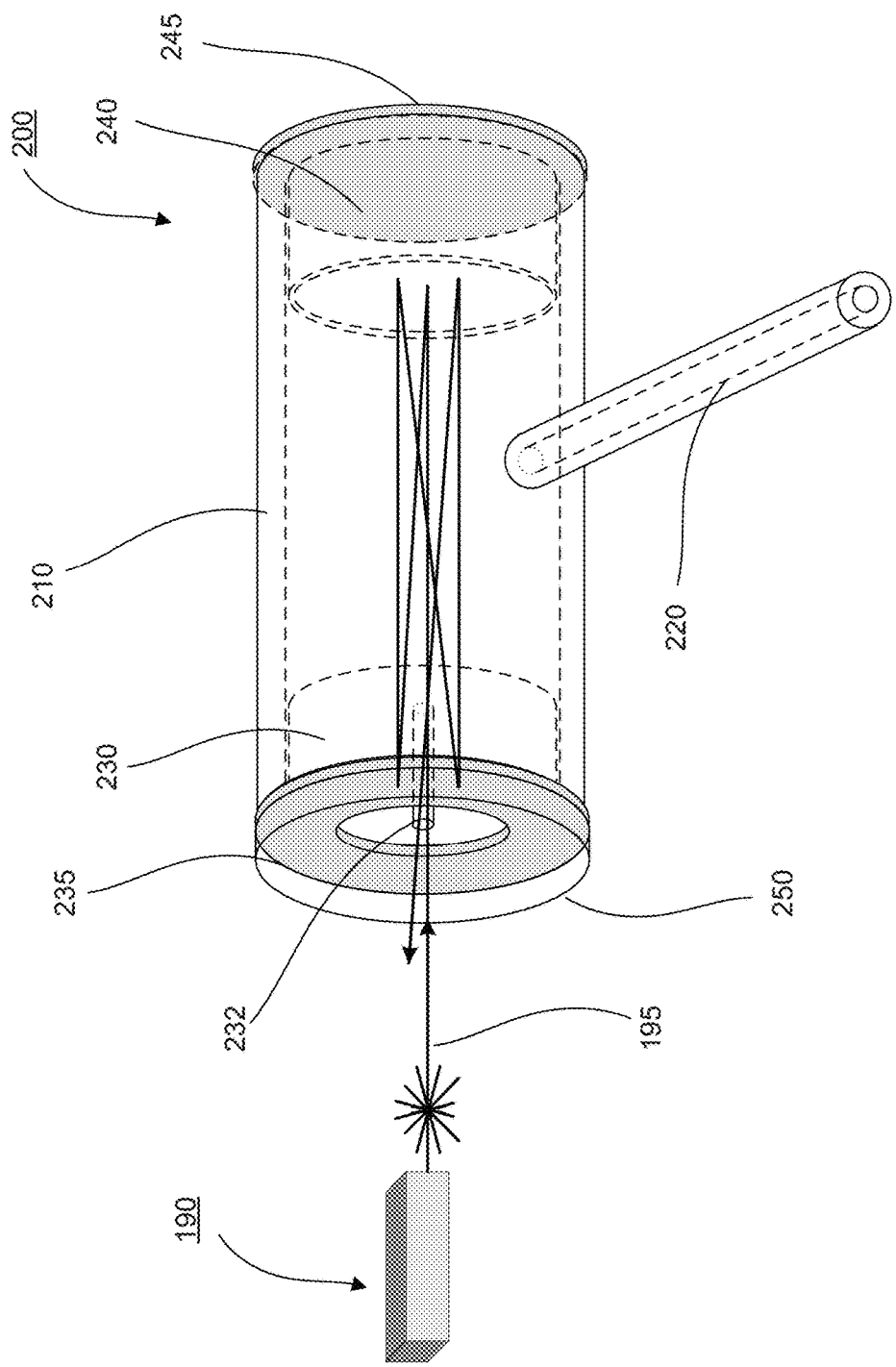

The bonded combination of back mirror 240 and back silicon disk 245 can be aligned and oriented relative to front mirror 230 (which has been anodically bonded to the cylindrical glass cell 210). For example, the bonded combination of front mirror 230 and cylindrical glass cell 210 can be positioned and held with any suitable mechanical assembly tool, and which can also be used to clamp the bonded combination of back mirror 240 and back silicon disk 245. For example, the bonded combination of back mirror 240 and back silicon disk 245 can be mounted on a rotation mount and then mounted on XY translation stage. Moreover, back silicon disk 245 can be positioned against the open end of cylindrical glass tube 210. Accordingly, the bonded combination of back mirror 240 and back silicon disk 245 can be centered and rotated relative to the front mirror 230 in order to configure the system as a whole to provide the designed beam pattern and number of beam passes on an active optical alignment stage. Such active alignment is depicted in FIG. 4. Because cylindrical glass tube 210 is already configured to provide the total length of the designed multi-pass cavity (through the length of multi-pass cell 200)—including the thicknesses of both front mirror 230 and back mirror 240, a designed beam pattern and number of beam passes can be controlled by rotating and centering the back mirror 240. After completing back mirror 240 alignment in order to provide the designed multi-pass beam pattern, a clamping mechanism can be used to hold back mirror 240 in position as it is aligned relative to front mirror 230. Accordingly, back silicon disk 245 can then be anodically bonded to cylindrical glass cell 210 without releasing the clamping mechanism.

Figure 5:
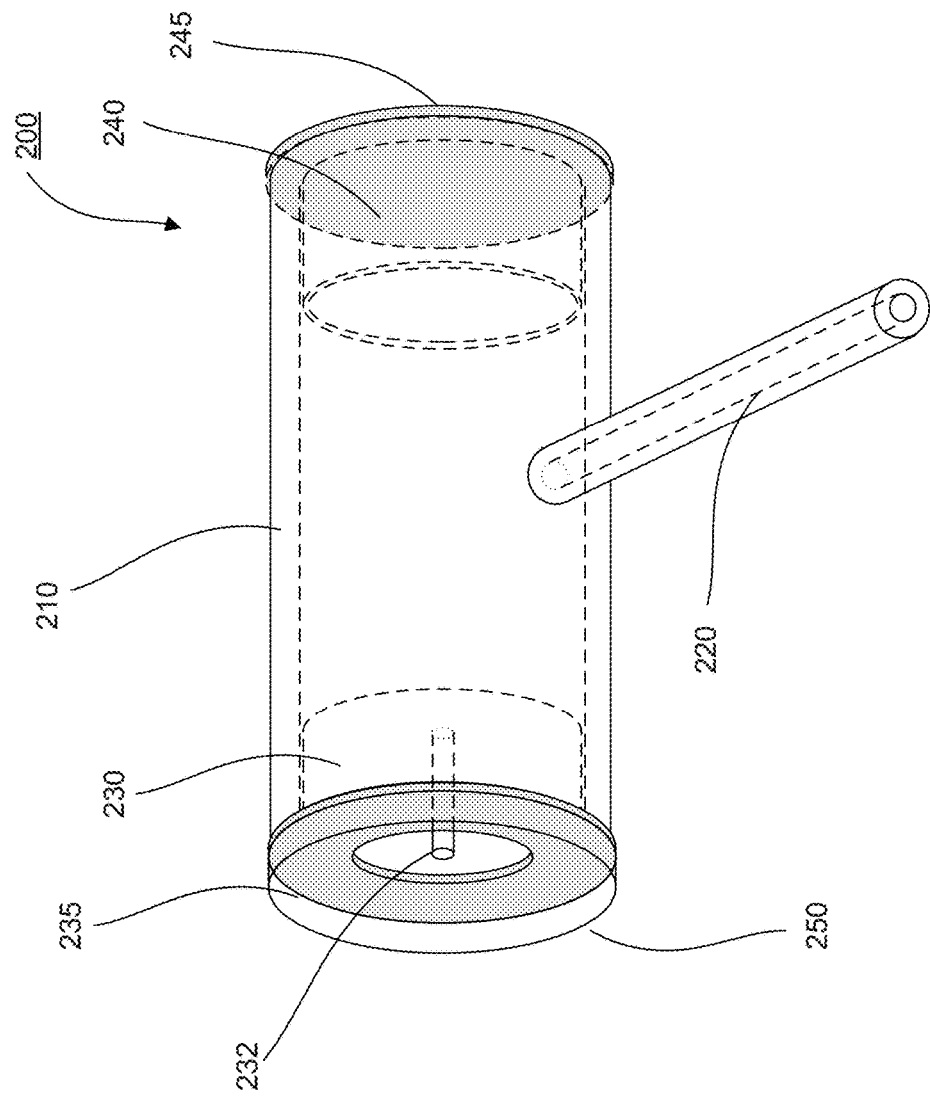

After completing the anodic bond between back silicon disk 245 and cylindrical glass cell 210, the back mirror 240 (and the multi-pass cell 200) can be released from the clamping mechanism. Completed multi-pass cell 200 is depicted in FIG. 5.

The anodic bond between cylindrical glass cell 210, front silicon disk 235 (including entrance window 250), and back silicon disk 345 provide a vacuum-tight enclosed cell. A vacuum leak test can be applied from stem 220 to verify proper anodic bonding. Multi-pass cell 200 can be evacuated and filled with alkali metal vapor (or other chemically reactive substance, or substance desired to be free of contamination) through the stem 220.

Figure 6:
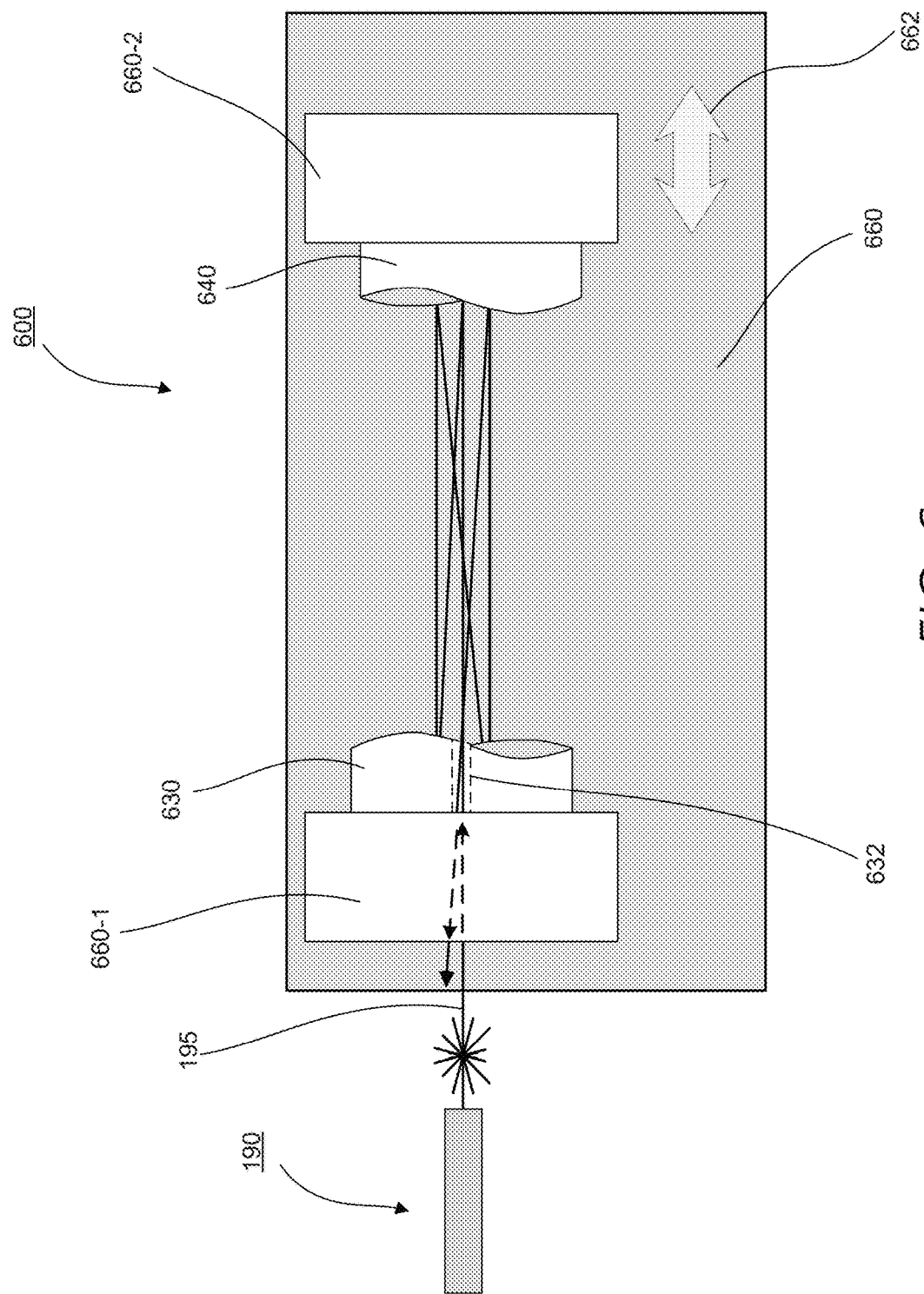
FIGS. 6-12 depict various processes associated with fabricating the embodiment of FIG. 13.

Another embodiment consistent with this disclosure can begin with the alignment process depicted in FIG. 6. For example, front mirror 630 (including aperture 632) and back mirror 640 can be mounted on optical alignment stage 660 in order to provide a designed number of beam passes and to provide a beam pattern in cavity. Rotation and tilt stage 660-1 can provide rotation and tilt to front mirror 630, and rotation and tilt stage 660-2 can provide rotation and tilt to back mirror 640. Moreover, a translation stage (not shown) can provide translation control to back mirror 640 along direction 662.

Figure 7:
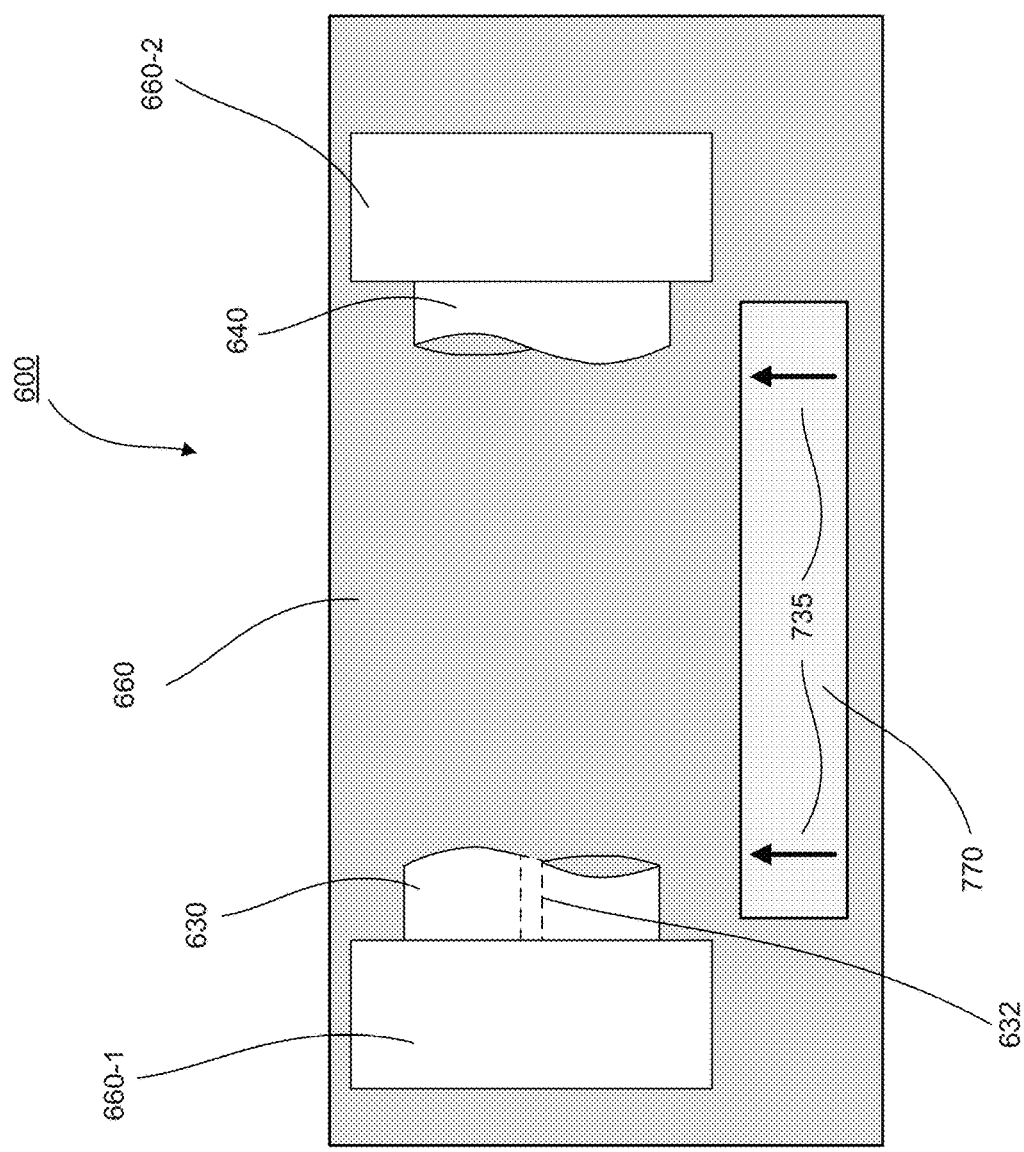
Figure 8:
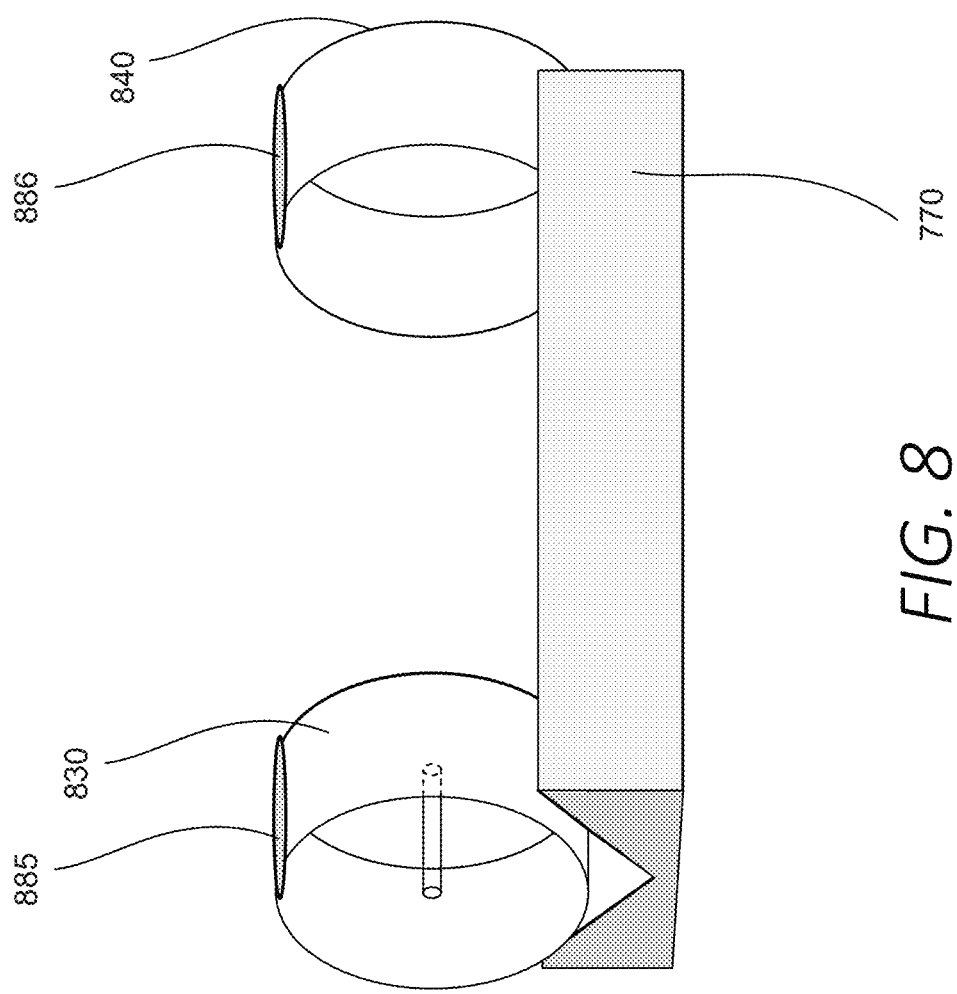

After alignment is complete, front mirror 630 and back mirror 640 can be fixed on a V-grove aluminum block 770 as shown in FIGS. 7 and 8 without disturbing the designed beam pattern and measured output power of the designed cavity. As described further below, hot wax (not shown) can be used to maintain the cavity configuration without disturbing output beam power.

For example, V-block 770 can be heated to wax melting temperature in order to melt wax on the V-block 770. When the melted wax is ready, V-block 770 can be moved (such as in direction 735) to touch the mirrors—as from the bottom of cavity. Preferably, the amount of wax can be just enough to cover a bottom edge of the mirrors by about 1-2 mm. The sides of the groove in the V-block 770 can also have wax in order to hold the designed cavity from the edge of front mirror 630 and back mirror 640. As the wax cools, front mirror 630 and back mirror 640 can be held in V-block 770. When wax and V-block 770 get to room temperature, the front mirror 630 and back mirror 640 can be released from their mounts on optical alignment stage 660. At this point, V-block 770 will have a multi-pass cavity setup on it.

To prepare the front mirror 630 and the back mirror 840 for bonding to a silicon substrate, front mirror 630 and back mirror 640 can be cut with a diamond rotating saw from a top edge of the mirrors. For example, each of the front mirror 630 and the back mirror 640 can be cut so as to provide a 2-3 mm² flat surface area for grinding and polishing as shown in FIG. 8. Front mirror 830, after cutting, provides a flat portion 885 for bonding to a silicon substrate. Similarly, back mirror 840, after cutting, provides a flat portion 886 for bonding to a silicon substrate. Accordingly, portion 885 of front mirror 830 can stand on and be bonded to a flat silicon substrate surface, and portion 886 of back mirror 840 can stand on and be bonded to a flat silicon substrate surface.

The coated surfaces of front mirror 830 and back mirror 840 can be protected during grinding and polishing. Surface flatness of portions 885 and 886 and quality of the flattened edge surface can be better than lambda/2 and 60-40 scratch-dig or better respectively.

After grinding, polishing and cleaning as previously described, front mirror 830 and back mirror 840 can be anodically bonded to a flat silicon substrate. Silicon substrate 935, shown in FIG. 9, can be configured to hold both front mirror 830 and back mirror 840, can be configured to be 2-3 mm longer than the designed cavity length, and a width of silicon substrate 935 can be 2-3 mm shorter than the diameters of front mirror 830 and back mirror 840.

Figure 9:
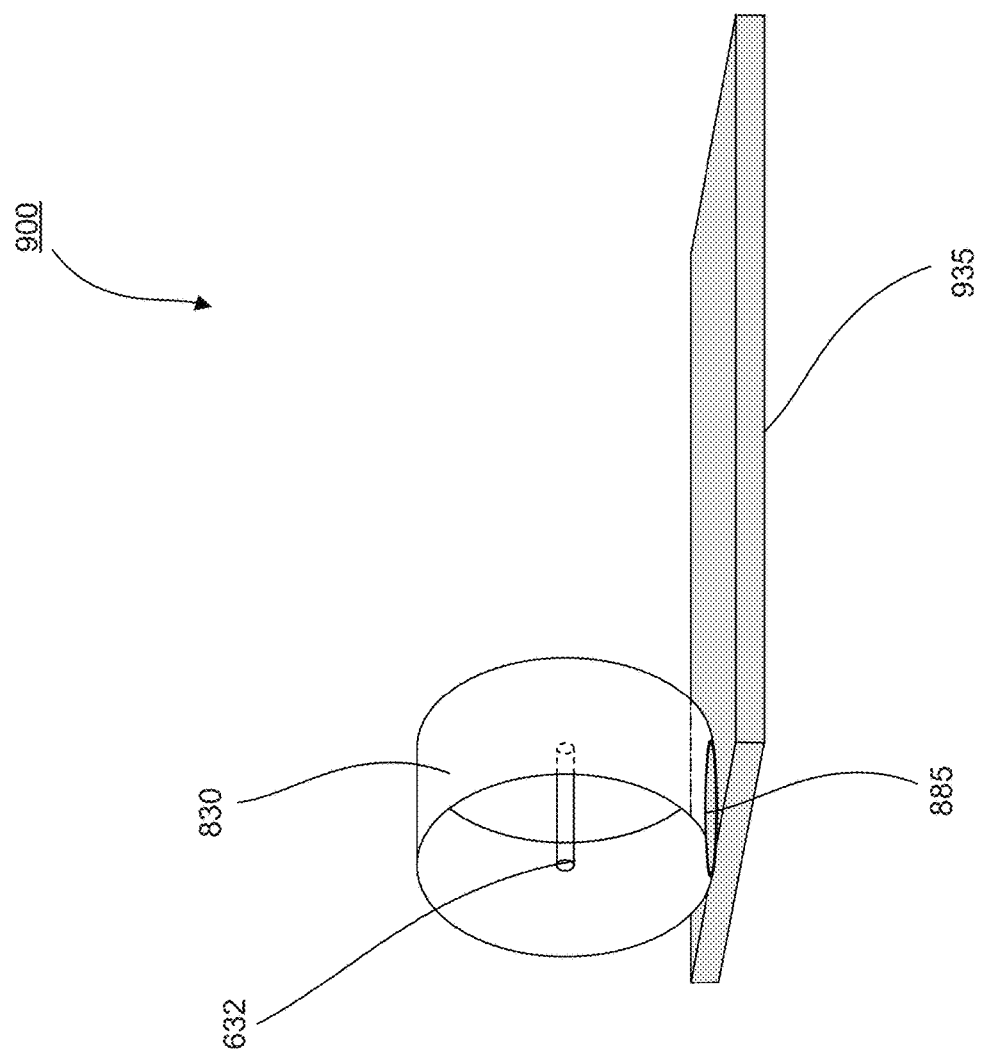
Figure 10:
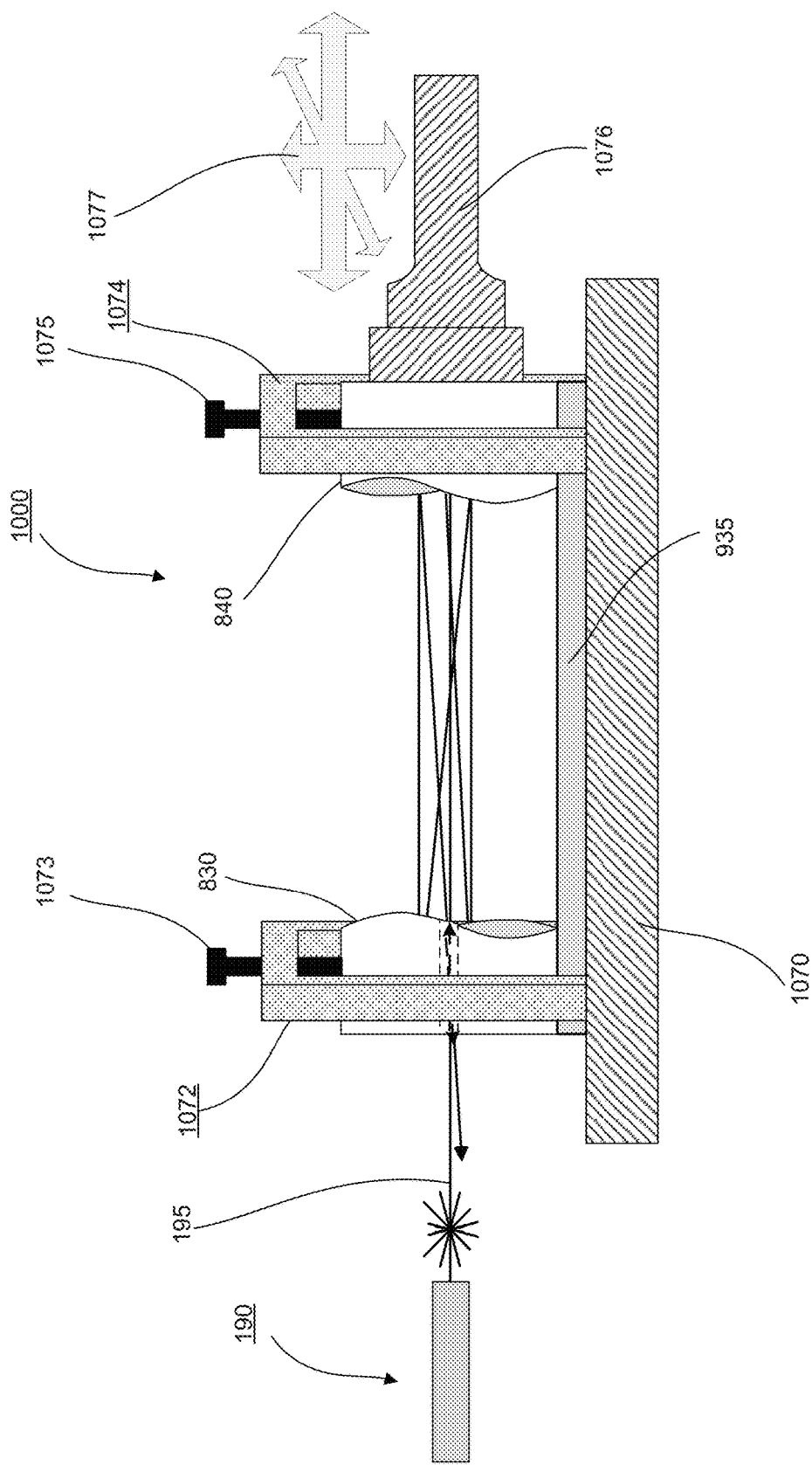

Preferably, an anodic bond can be applied to one mirror at a time. And preferably, the front mirror 830 can be bonded on silicon substrate 935 first as depicted in FIG. 9. After front mirror 830 is bonded to silicon substrate 935, bonded front mirror 830 and silicon substrate 935 can be mounted on a mechanical assembly 1000, which can include a clamping mechanism 1074 for back mirror 840. Preferably, back mirror 840 can be held with an extension post (such as with vacuum holder 1076) to a goniometer to be tilted left or right on its flattened portion 886. Goniometer can be mounted on X Y Z stages to place back mirror 840 on the silicon substrate 935. Accordingly, all three degrees of freedom indicated with arrows 1077 are available. A designed multi-pass beam pattern and number of beam passes are already determined by the orientation of the flattened portions 885 and 886 of front mirror 830 and back mirror 840, respectively. Because front mirror 830 is already anodically bonded to silicon substrate 935, a multi-pass pattern can be realigned by tilting back mirror 840 at a distance corresponding to cavity length. Cavity length can be adjusted by using a Z (horizontal) transition stage (not shown). When an output beam power and a multi-pass pattern are aligned as previously set (see FIG. 10), back mirror 840 can be clamped on silicon substrate 935 using clamping mechanism 1074 so that back mirror 840 is held together with front mirror 830 (which is held by clamping mechanism 1072).

Mechanical assembly 1000 can include a metal base 1070 and electrically isolated posts (which are portions of clamping mechanisms 1072 and 1074). Spring-loaded screws 1073 and 1075 can be used to fix front mirror 830 and back mirror 840 within the electrically isolated posts. The electrically isolated posts can include (for example) ceramic material.

Back mirror 840 can now preferably be taken off the extension post 1076. Mechanical assembly 1000 now carries front mirror 830 and clamped back mirror 840 on silicon substrate 935. An anodic bond now can be applied on clamped back mirror 840 while the configuration is on the mechanical assembly tool. After the anodic bond is applied between the back mirror 840 and the silicon substrate 935, the designed multi-pass cavity is fixed and bonded on silicon substrate 935. This is depicted in FIG. 11.

Figure 11:
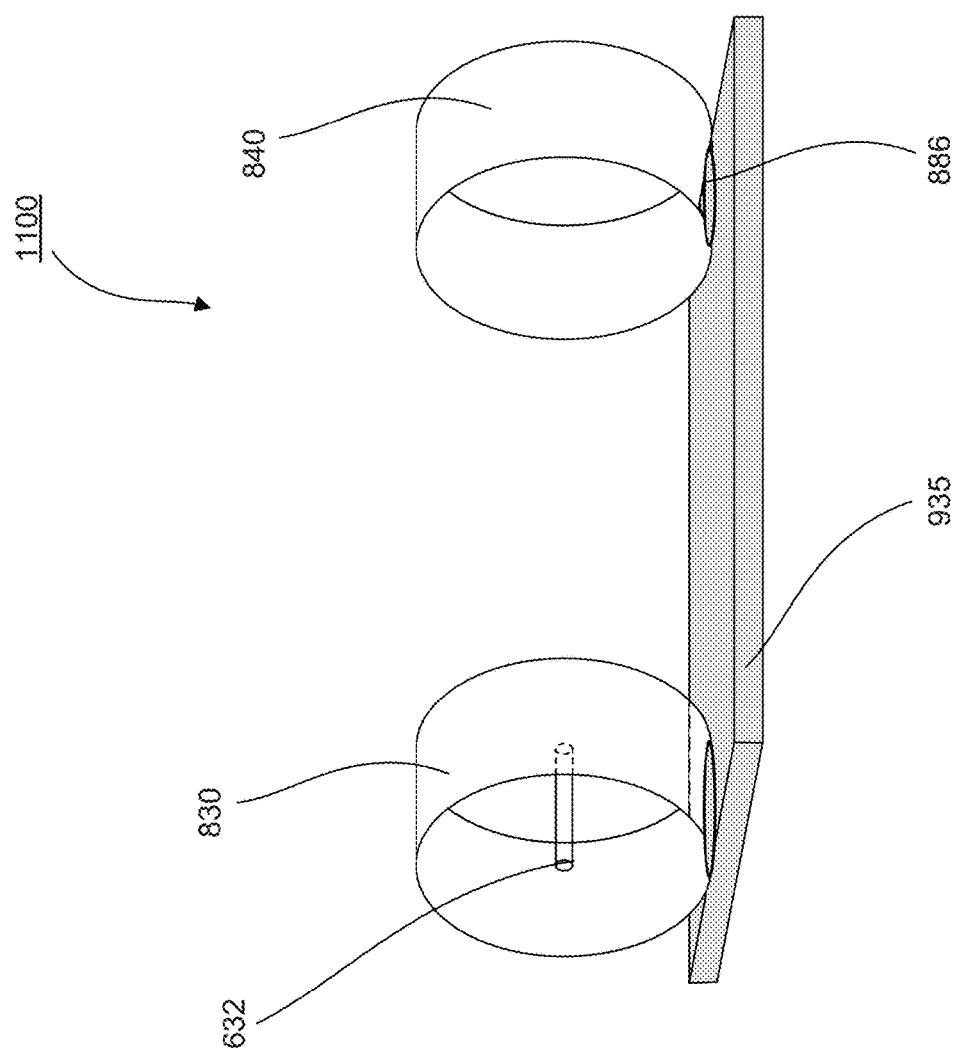
Figure 12:
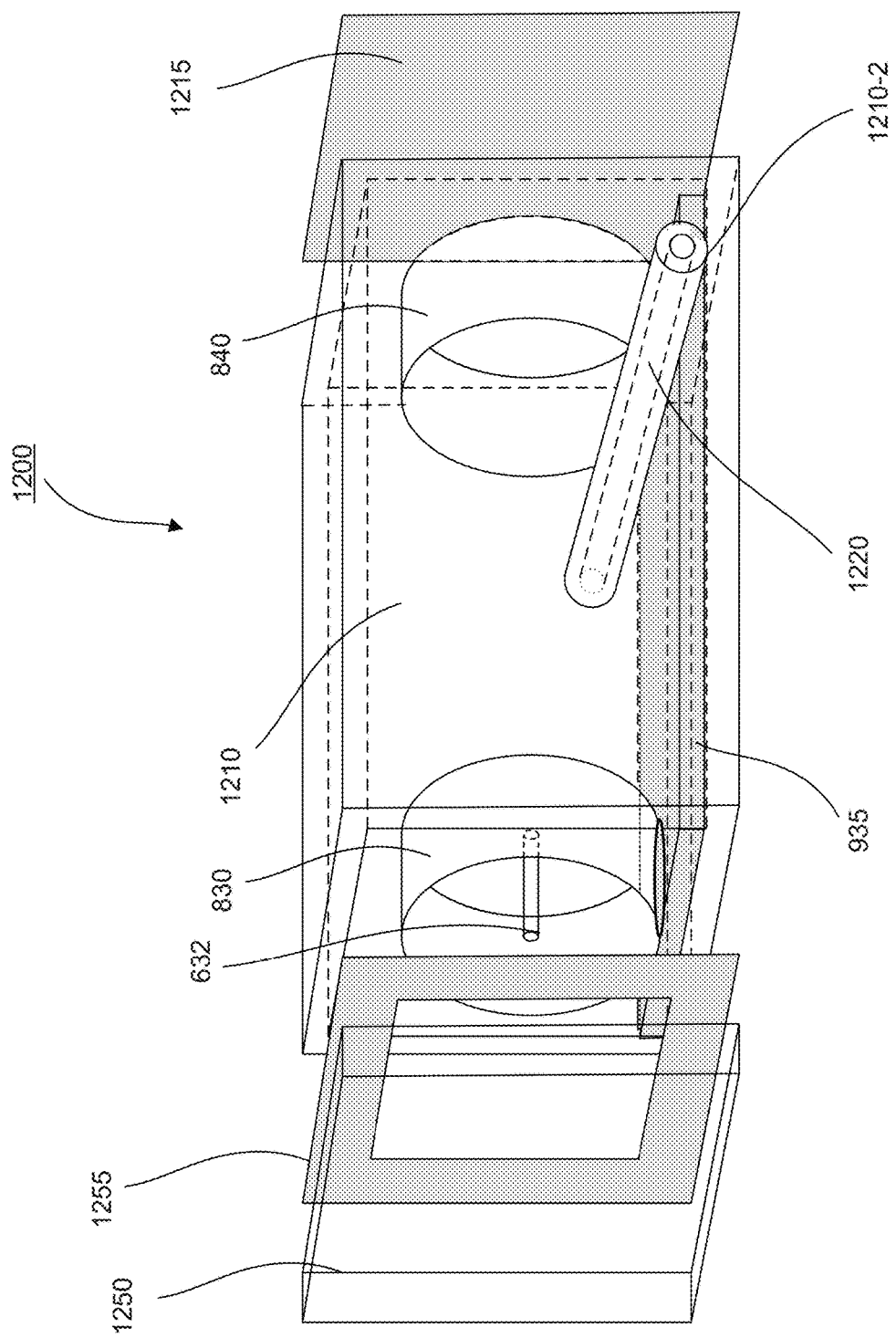

Fixed multi-pass cavity 1100 of FIG. 11 can next be bonded onto the base of a rectangular glass cell, such as rectangular glass cell 1210 of FIG. 12. As above, rectangular glass cell 1210 can have a stem 1220. And again, both ends of rectangular glass cell 1210 can polished as previously described in connection with FIGS. 2-5.

After both ends of rectangular glass cell 1210 are prepared for anodic bonding, fixed multi-pass cavity 1100 can be bonded on one of the inner surfaces of rectangular glass cell 1210, such as the bottom inner surface 1210-2.

Figure 13:
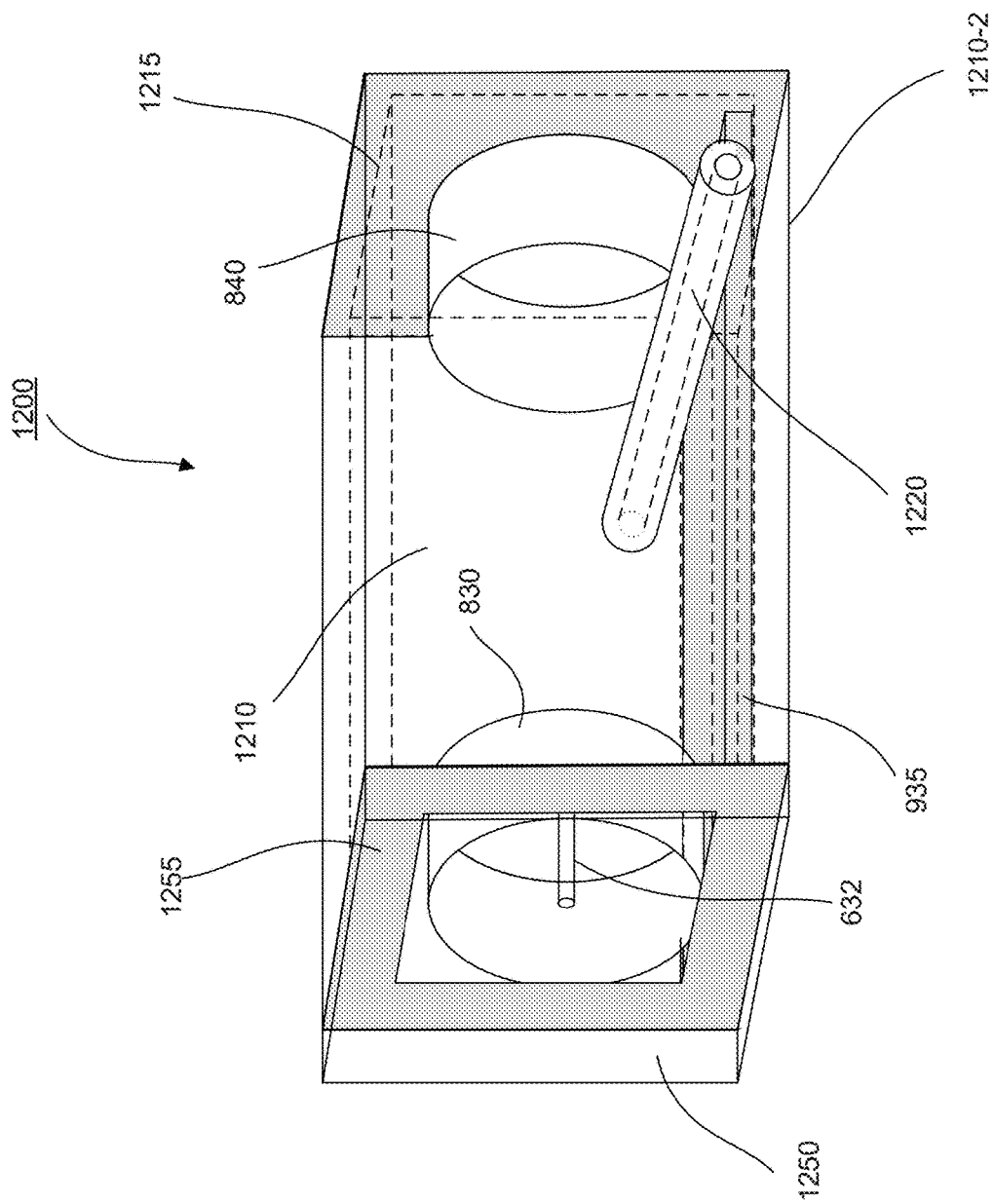
FIG. 13 another embodiment consistent with the disclosure.

After such anodic bonding, rectangular glass cell 1210 can be closed and sealed with PYREX windows (or other suitable borosilicate glass) for holding vacuum and alkali-metal vapor gas. As previously described in connection with multi-pass cell 200, completed multi-pass cell 1200 can be configured to withstand chemically reactive substances (gas or liquid), such as alkali-metal vapor, at high temperature for prolonged periods of time. In addition, or alternatively, the multi-pass cell 1200 can be configured to contain any substance (gas or liquid) that is desired to be free of contamination. A process for bonding an entrance window 1250 on an entrance side of rectangular glass cell 1210 has been already described in connection with FIGS. 2-5. A similar anodic bonding method can apply the other end of rectangular tube cell with uncoated PYREX window (not shown), or other suitable borosilicate gas, onto silicon wafer 1215. After front and back windows are sealed, rectangular glass cell 1210 provides an internal fixed multi-pass cavity. This is depicted in FIG. 13 as multi-pass cell 1200.

Consistent with yet another embodiment, a glass-blown vapor cell 1410 can be configured to provide an optically high quality vapor cell. Consistent with this disclosure, this embodiment can be implemented with any PYREX vapor cell or any cell using suitable borosilicate glass (such as cell 1410 of FIG. 14), and replaces an entrance side 1410-3 of the cell 1410 (which may otherwise provide wave front distortion) with an optical quality and AR coated window 1440. This embodiment also allows one to easily insert a fixed multi-pass cavity into the cell 1410, and allows one to seal the cell 1410.

Consistent with this embodiment, front mirror 830 and back mirror 840 can be bonded on a silicon substrate 935 as has been described above in connection with FIGS. 6-11. Accordingly, the front mirror 830 and the back mirror 840 can be provided as anodically bonded on silicon substrate 935. Preferably, however, the dimension of the silicon substrate in this embodiment can be 4-8 mm longer than the length of the fixed multi-pass cavity, and also larger (in width) than the diameters of front mirror 830 and back mirror 840.

Figure 14:
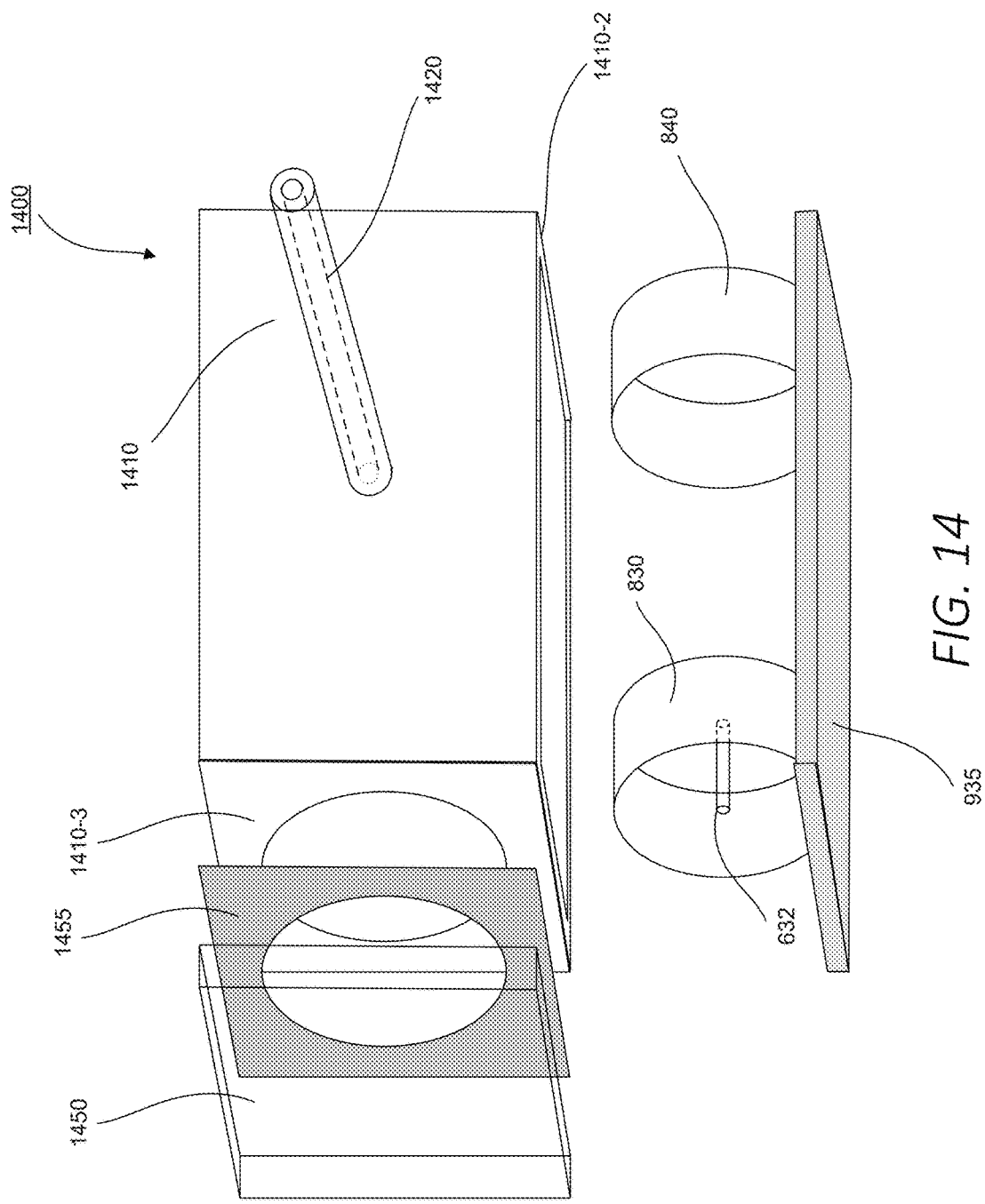
FIGS. 14-15 depict fabrication processes and a resulting further embodiment (FIG. 15) consistent with the disclosure.

Further consistent with this embodiment, a rectangular glass cell 1410 is provided using glass blowing techniques. The rectangular glass cell can be core drilled from entrance side 1410-3 and can have a rectangular opening cut off from side 1410-2 as shown in FIG. 14.

Accordingly, any distorted glass surface on an entrance side 1410-3 of the rectangular glass cell 1410 can be removed by drilling a hole from the entrance side 1410-3. Moreover, polished glass on the edges of hole 1410-3 can be used for anodic bonding to bond a double-sided AR coated window 1450 to silicon disk 1455 (such as a silicon wafer).

Figure 15:
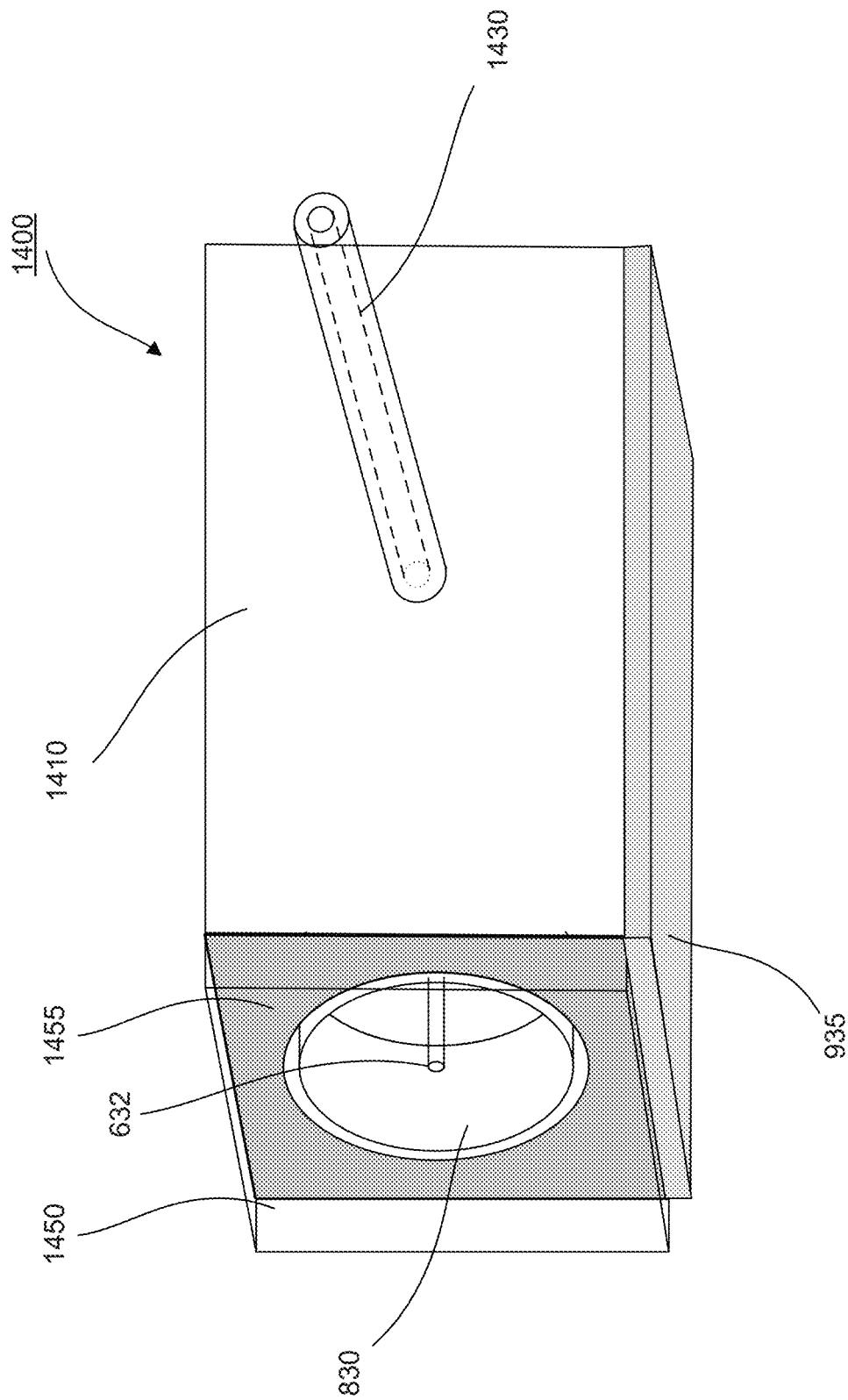

The rectangular opening 1410-2 provides an opening to insert the fixed multi-pass cavity including front mirror 830, back mirror 840, and silicon substrate 935. The edges of the rectangular opening 1410-2 can be used for anodic bonding to substrate 935 as shown in FIG. 15 to seal the multi-pass cell 1400. The surfaces which will be anodically bonded need to be polished before anodic bonding as described previously.

Because the entrance side 1410-3 is bonded to an AR coated window 1450 and rectangular opening 1410-2 is bonded to silicon substrate 935, the multi-pass cell 1400 can be completely sealed to hold vacuum.

Other embodiments will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. An optical apparatus comprising:
a sealable multi-pass optical cell comprising:
a housing comprising a cavity bound at a first end by a first optical element supported by a first support and at a second end by a second optical element supported by a second support, the housing further comprising a sealable inlet arranged along a length of the housing and configured to allow access to the cavity to provide a passage to fill the cavity with a chemically reactive substance, wherein the first optical element comprises an anti-reflection coating on an outward facing surface and comprises an aperture configured to permit at least a portion of incident radiation to be transmitted by the first optical element, through the cavity, and onto the second optical element, wherein at least a portion of the at least the portion of the incident radiation is reflected by the second optical element and directed back through the aperture,
wherein the first optical element and the second optical element comprise glass and wherein the first support and the second support comprise silicon;
wherein the housing comprises glass;
wherein the first optical element and the first support are anodically bonded together and the second optical element and the second support are anodically bonded together;
wherein the first support and the housing are anodically bonded together and the second support and the housing are anodically bonded together, and
wherein the first optical element and the second optical element are aligned using a laser prior to being bonded with the housing to set a desired rotation of the incident radiation and distance between the first optical element and the second optical element to provide a desired number of passes in the multi-pass optical cell.

2. The apparatus of claim 1, wherein the glass is borosilicate glass, and wherein the second optical element is a mirror.

3. The apparatus of claim 1, wherein the glass includes PYREX, and wherein the second optical element is a mirror.

4. The apparatus of claim 1, wherein the first optical element is selected from a set consisting of: a lens and a prism.

5. The apparatus claim 1, wherein the second optical element comprises glass.

6. The apparatus of claim 1, wherein the first optical element is a mirror with the aperture for entrance and exit of a laser beam, and wherein the second optical element is a window with anti-reflective coating.

7. The apparatus of claim 1, wherein the first optical element is a mirror with the aperture for entrance and exit of a laser beam, and wherein the second optical element is a mirror.

8. The apparatus of claim 1, wherein the second optical element is selected from a set consisting of: a lens and a prism.

9. The apparatus of claim 1, wherein the housing is configured to couple the sealable inlet to a vacuum system for evacuating and filling the cell with the chemically reactive substance, wherein the chemically reactive substance comprises an alkali-metal vapor.

10. The apparatus of claim 1, wherein the first support is anodically bonded to the housing on a side of the first support and about a perimeter of the side, and wherein an inner portion of the side is bonded to the first optical element.

11. The apparatus of claim 1, wherein the second support is anodically bonded to the housing on a side of the second support, and wherein the second optical element is anodically bonded to an opposite side of the second support.

12. The apparatus of claim 1, wherein the aligning provides a desired beam pattern and a number of beam passes between the first optical element and the second optical element.

13. A method providing optical components with durable bonds, the method comprising:
providing a sealable multi-pass optical cell comprising:
a housing comprising a cavity bound at a first end by a first optical element supported by a first support and at a second end by a second optical element supported by a second support, the housing further comprising a sealable inlet arranged along a length of the housing and configured to allow access to the cavity to provide a passage to fill the cavity with a chemically reactive substance, wherein the first optical element comprises an anti-reflection coating on an outward facing surface and comprises an aperture configured to permit at least a portion of incident radiation to be transmitted by the first optical element, through the cavity, and onto the second optical element, wherein at least a portion of the at least the portion of the incident radiation is reflected by the second optical element and directed back through the aperture, aligning the first optical element and the second optical element using a laser prior to bonding the first optical element to the first support and bonding the second optical element to the second support to set a desired rotation of the incident radiation and distance between the first optical element and the second optical element to provide a desired number of passes in the multi-pass optical cell; and anodically bonding the first optical element and the first support together and anodically bonding the second optical element and the second support together; and anodically bonding the first support and the housing together and anodically bonding the second support and the housing together;

wherein the first optical element and the second optical element comprise glass, and the first support and the second support comprise silicon, and the housing comprises glass.

14. The method of claim 13, wherein the glass is borosilicate glass, and wherein the second optical element is a mirror.

15. The method of claim 13, wherein the glass includes PYREX, and wherein the second optical element is a mirror.

16. The method of claim 13, wherein the first optical element is selected from a set consisting of: a lens and a prism.

17. The method of claim 13, wherein the second optical element comprises glass.

18. The method of claim 17, further comprising actively aligning the first optical element and the second optical element.

19. The method of claim 18, wherein the first optical element is a mirror with the aperture for entrance and exit of a laser beam, and wherein the second optical element is a mirror.

20. The method of claim 13, wherein the first optical element is a mirror with the aperture for entrance and exit of a laser beam, and wherein the second optical element is a window with anti-reflective coating.

21. The method of claim 13, wherein the first optical element is a mirror with the aperture for entrance and exit of a laser beam, and wherein the second optical element is a mirror.

22. The method of claim 13, wherein the second optical element is selected from a set consisting of: a lens and a prism.

23. The method of claim 13, wherein the housing is configured to couple the sealable inlet to a vacuum system for evacuating and filling the cell with the chemically reactive substance, wherein the chemically reactive substance comprises an alkali-metal vapor.

24. The method of claim 13, wherein the first support is anodically bonded to the housing on a side of the first support and about a perimeter of the side, and wherein an inner portion of the side is bonded to the first optical element.

25. The method of claim 13, wherein the second support is anodically bonded to the housing on a side of the second support, and wherein the second optical element is anodically bonded to an opposite side of the second support.

26. The method of claim 13, wherein the aligning provides a desired beam pattern and a number of beam passes between the first optical element and the second optical element.

* * * * *